(12) United States Patent
Akashi et al.

(10) Patent No.: US 6,423,135 B1
(45) Date of Patent: Jul. 23, 2002

(54) METHOD FOR MANUFACTURING A SINGLE CRYSTAL

(75) Inventors: Yoshihiro Akashi; Yasuhiro Kogure, both of Hyogo (JP)

(73) Assignee: Sumitomo Metal Industries, Ltd., Osaka (JP)

(*) Notice: Subject to any disclaimer, the term of this patent is extended or adjusted under 35 U.S.C. 154(b) by 0 days.

(21) Appl. No.: 09/587,188

(22) Filed: Jun. 5, 2000

(51) Int. Cl.[7] ............................................... C30B 15/20
(52) U.S. Cl. ............................. 117/13; 117/14; 117/15; 117/911
(58) Field of Search ........................... 117/14, 15, 911, 117/13

(56) References Cited

U.S. PATENT DOCUMENTS

| 5,487,355 A | * | 1/1996 | Chiou et al. | 117/13 |
| 5,885,347 A | * | 3/1999 | Tomioka et al. | 117/218 |
| 5,935,321 A | * | 8/1999 | Chiou et al. | 117/13 |
| 6,019,836 A | * | 2/2000 | Izumi | 117/13 |
| 6,099,642 A | * | 8/2000 | Kurosaka et al. | 117/218 |
| 6,226,032 B1 | * | 5/2001 | Lee et al. | 348/85 |

FOREIGN PATENT DOCUMENTS

JP          62288191 A        12/1987

* cited by examiner

*Primary Examiner*—Felisa Hiteshew
(74) *Attorney, Agent, or Firm*—Morrison & Foerster LLP (57) ABSTRACT

A method for improving the productivity when a single crystal is pulled while being mechanically held at a knob section formed at an upper end of the crystal. By controlling the crucible rotational speed, a reproducible knob section having a complex shape can be formed in a more time efficient manner than if the knob section were formed by controlling the temperature of the heater.

3 Claims, 7 Drawing Sheets

METHOD FOR MANUFACTURING A SINGLE CRYSTAL

FIELD OF THE INVENTION

The present invention relates generally to a method for manufacturing a silicon single crystal using a pulling procedure based on a Czochralski (CZ) method, and more specifically, to a method for manufacturing a silicon single crystal by pulling a produced crystal while holding it at its upper end.

BACKGROUND OF THE INVENTION

Figure 1:
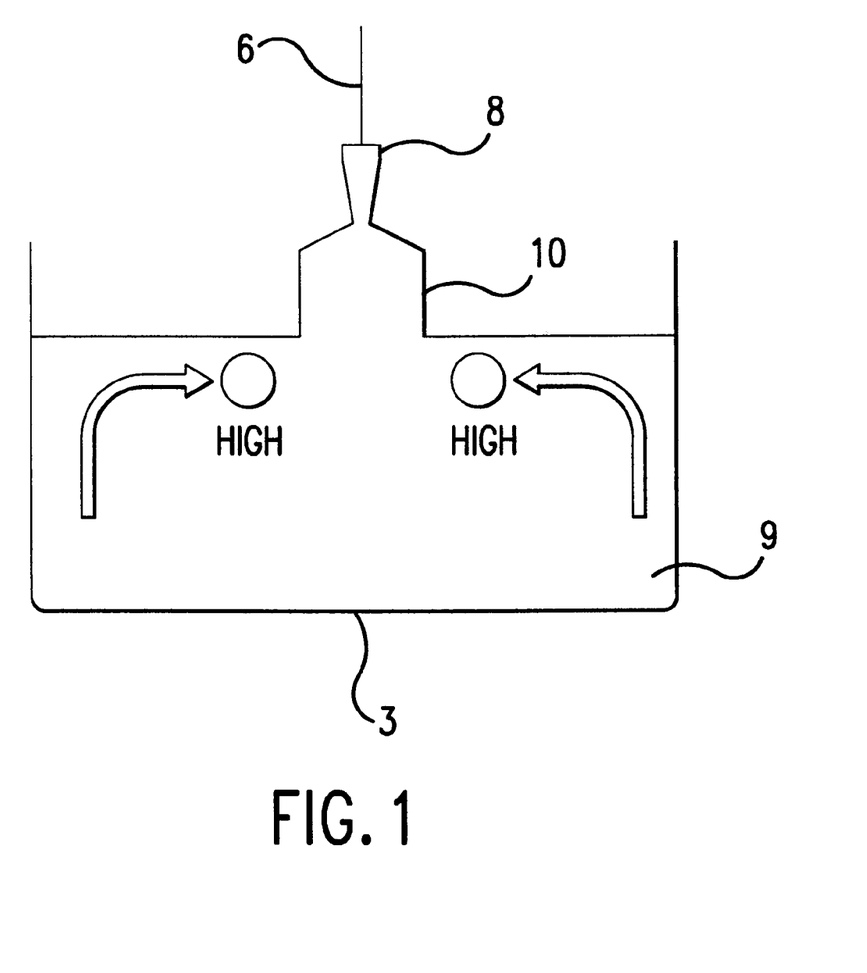
FIG. 1 illustrates a prior art method of pulling up a single crystal by the CZ method.

A silicon single crystal manufactured by the CZ method is widely used as the material for silicon wafers in semiconductor devices. FIG. 1 illustrates a conventional method for manufacturing a silicon single crystal by the CZ method. The seed crystal 8, held by the lower end of pulling-up shaft 6, is immersed in a silicon material melting solution 9 in a crucible 3, and pulled up by the shaft 6. The single crystal 10 is grown below the seed crystal 8. During this process, the crucible 3 and shaft 6 are rotated in the reverse direction from each other.

The seed crystal 8 is in the form of a slender rod, 10 mm in diameter. It is connected to a seed holder at the top thereof and immersed partly in the silicon material melting solution in the lower section. Immersing the seed crystal in a silicon material melting solution kept at a higher temperature causes a thermal shock to the seed crystal and leads to dislocation of the crystal. Therefore, after the seed crystal is immersed in the silicon material melting solution, it is drawn from the melting solution to reduce its diameter, and to prevent the crystal from being dislocated. This procedure is referred to as the "neck process." The diameter of the neck is generally 5 mm or less, and is preferably 3 mm or less.

Conventionally, a single crystal of silicon manufactured with the CZ method is approximately 8 inches in diameter and weighs 100 kg. Recently, larger single crystals, 10–12 inches in diameter are increasingly in demand.

Single crystals rapidly gain weight, as their diameter increases. For example, a crystal having a 12 inch diameter may weigh 200 kg. Most of the weight of a single crystal is concentrated in the neck, which is the top section of the crystal and has the smallest diameter. The fracture strength of silicon is approximately 20 kg/mm$^2$. Thus, in order to securely hold a silicon single crystal weighing 200 kg the drawn seed section needs to have a diameter which is larger than 5 mm. It is therefore difficult to pull up a single crystal having a 12 inch diameter.

Figure 2:
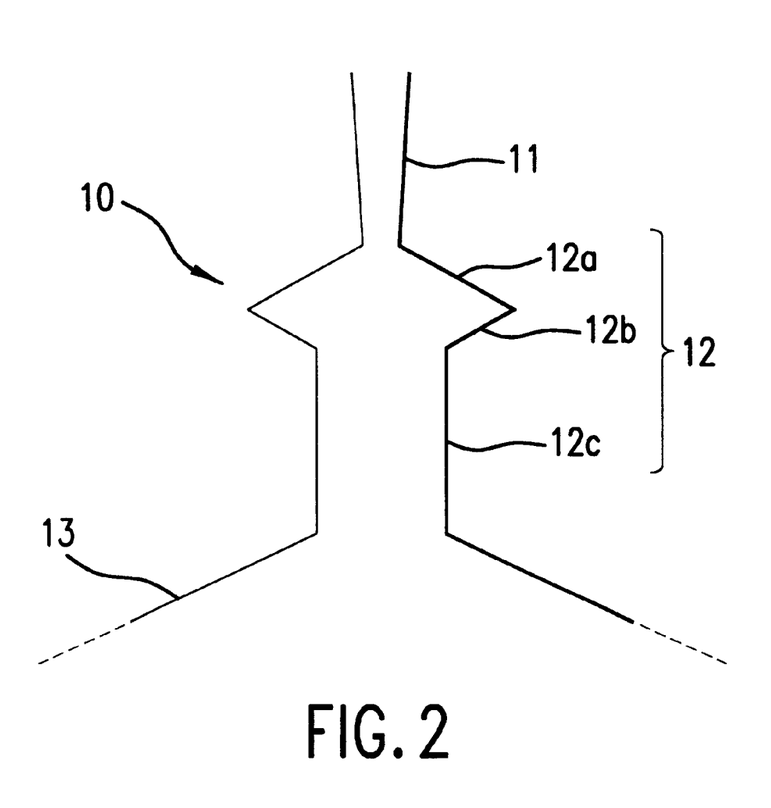
FIG. 2 illustrates a knob shape.

One technique used to solve this problem pulls up the crystal without holding the neck. This technique is disclosed by Japanese Patent Publication No. 5-65477, and is illustrated in FIG. 2. In this technique, section 12 which mechanically holds the single crystal is formed. Section 12 is larger in diameter than the neck 11 and forms the crystal body section 13. Single crystal 10 can be pulled up while being held at the section 12 by a separate mechanical device, e.g., chuck mechanism. While Section 12 has a larger diameter in the upper section than in the lower section, the diameter of the lower section is still larger than the diameter of the neck. The diameter of the upper section is shaped like a knob, and the diameter of the lower section is constricted. Thus, section 12 may be referred to as a knob, or a constricted section. The knob section 12 is formed with a process similar to the one used to form the body of the single crystal 10. This process includes controlling the pulling up speed and the temperature of the silicon material melting solution by varying the output of the heater set around the crucible.

A single crystal of 12 inches in diameter can be stably pulled up when it is held by the knob section, rather than at the neck. However, forming of the knob section creates several problems associated with the use of a combination of controlling the pulling up speed and the heater output.

When pulling up a single crystal with the CZ method, an increase in the pulling speed decreases the diameter of the crystal, and vice versa. It is therefore possible to form a knob section by controlling pulling speed alone. However, because the pulling speed greatly decreases during the initial stage of the formation, formation of the knob section solely by controlling the pulling speed takes a long time and is therefore inefficient. Thus, using a combination of controlling pulling speed and heater output is necessary.

Increasing temperature at which the melting is performed decreases the diameter of the crystal. However, after the heater output level changes, e.g. the temperature of the heater is increased, it may take a significant amount of time for the temperature of the melting solution to increase and reach a target level. Thus, controlling the output by changing the output of the heater makes it impractical to form a knob section having a complex shape because such diameter should be controlled in a short time.

In other words, the shape of the knob section is largely determined by the chuck structure which holds it. There are some cases where the knob section cannot be mechanically held, depending on the type and extent of deviation of its shape from the target shape. Combining control of the heater output with control of the pulling speed, the reproducibility of the knob section shape is reduced, because of the large amount of time required to form a knob of the target shape. The knob section may also be difficult to mechanically hold, thereby yielding further inefficiencies.

Accordingly, a need exists for an efficient method for manufacturing a silicon single crystal, including forming a knob section in the upper section of the single crystal, by which the single crystal is mechanically held while being pulled up.

SUMMARY OF THE INVENTION

The method of the present invention for manufacturing a silicon single crystal by the CZ method forms a knob section in the upper end of the produced crystal. The manufactured single crystal is mechanically held by the knob section while it is pulled-up from the material melting solution in the crucible. The knob section is formed by controlling the rotational speed of the crucible.

DETAILED DESCRIPTION OF THE INVENTION

Introduction

Referring to FIG. 1, a conventional CZ method for pulling up the single crystal generates a natural convection in the material melting solution 9 in the crucible 3, while the material melting solution 9 is heated by a heater. This convection occurs when the material melting solution 9 is heated along the inner side wall of the crucible 3 and moves upward along the inner side wall and then towards the center of the crucible 3. When the rotational speed of the crucible is increased, a centrifugal force causes the material melting solution 9 to moving toward the crucible center along the free surface to suppress. This movement of the material melting solution 9 decreases the temperature at the solid-liquid interface, causing an increase in the diameter of the crystal and vice versa when the rotational speed of the crucible 3 is decreased. Thus, the diameter of the crystal may be controlled by controlling the rotational speed of the crucible.

The knob section of complex shape can also be reproduced, or formed by controlling the rotational speed of the crucible. The crystal diameter responds much more to changes in rotational speed than to changes in output of the heater. Forming the knob section by changing the rotational speed may be done in a time efficient manner.

Figure 3:
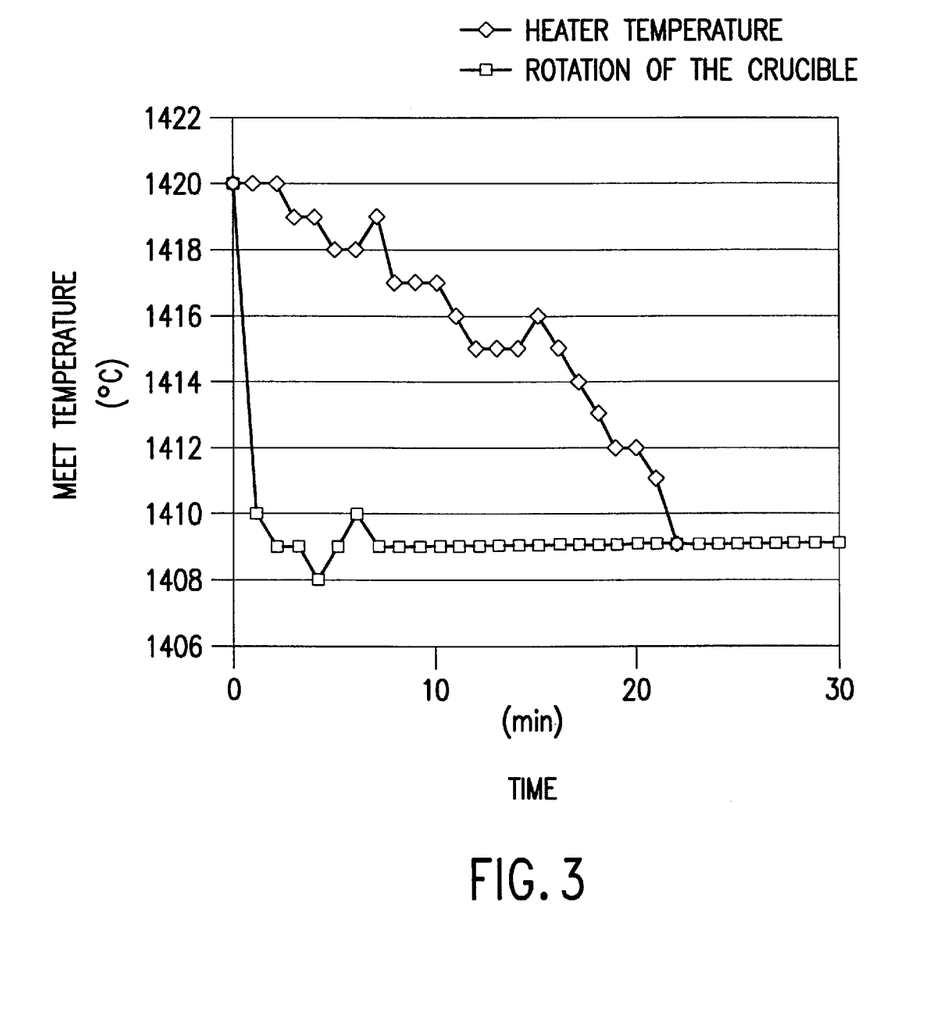
FIG. 3 illustrates the response of the temperature of the material melting solution to changes in heater output and crucible rotational speeds.

FIG. 3 depicts a time chart showing temporal changes in the temperature of a material melting solution when the heater output and the crucible rotational speed are changed in a stepwise fashion. Decreasing the temperature of the material melting solution from 1420 to 1409° C. takes at least 20 min. when performed by changing the heater output. However, this amount of time is greatly reduced, to several minutes, when the crucible rotational speed is used to decrease the temperature of the material melting solution.

The method of the present invention forms the knob section of a complex shape by controlling the rotational speed of the crucible, supporting reproduction of the knob in a time efficient manner.

When controlling the single-crystal pulling speed to form the knob section, the pulling speed is decreased during the initial stage of knob formation because the amount of heat released from a slender neck is insufficient to increase the crystal diameter from that of the neck by increasing the crucible rotational speed alone. After the initial stage of knob formation, the pulling speed is increased in a controlled manner to reduce the total time required to form the knob section. Increasing the rotational speed of the crucible in a controlled manner offsets the formation of a crystal having a reduced diameter which may result from increasing the pulling speed.

The pulling speed during the initial stage of knob formation is preferably, but not limited to, between 0.3 and 0.7 mm/min. At below 0.3 mm/min, it may take much more time to form the knob section. At above 0.7 mm/min, it may be difficult to increase the diameter of the crystal beyond that of the neck.

The pulling speed during the final stage of knob formation is preferably, but not limited to, between 2 and 3 mm/min. At below 2 mm/min, it may difficult to sufficiently increase the knob formation speed. On the other hand, at above 3 mm/min it may be difficult to smoothly move from this step into the shoulder-forming step.

The crucible rotational speed is between 7 and 15 rpm during the knob formation process. At above 15 rpm, the knob diameter tends to fluctuate due to the increased mechanical vibration of the crucible. At below 7 rpm, on the other hand, the material melting solution temperature may fluctuate and cause the knob shape to become unstable.

Detailed Description

Figure 4:
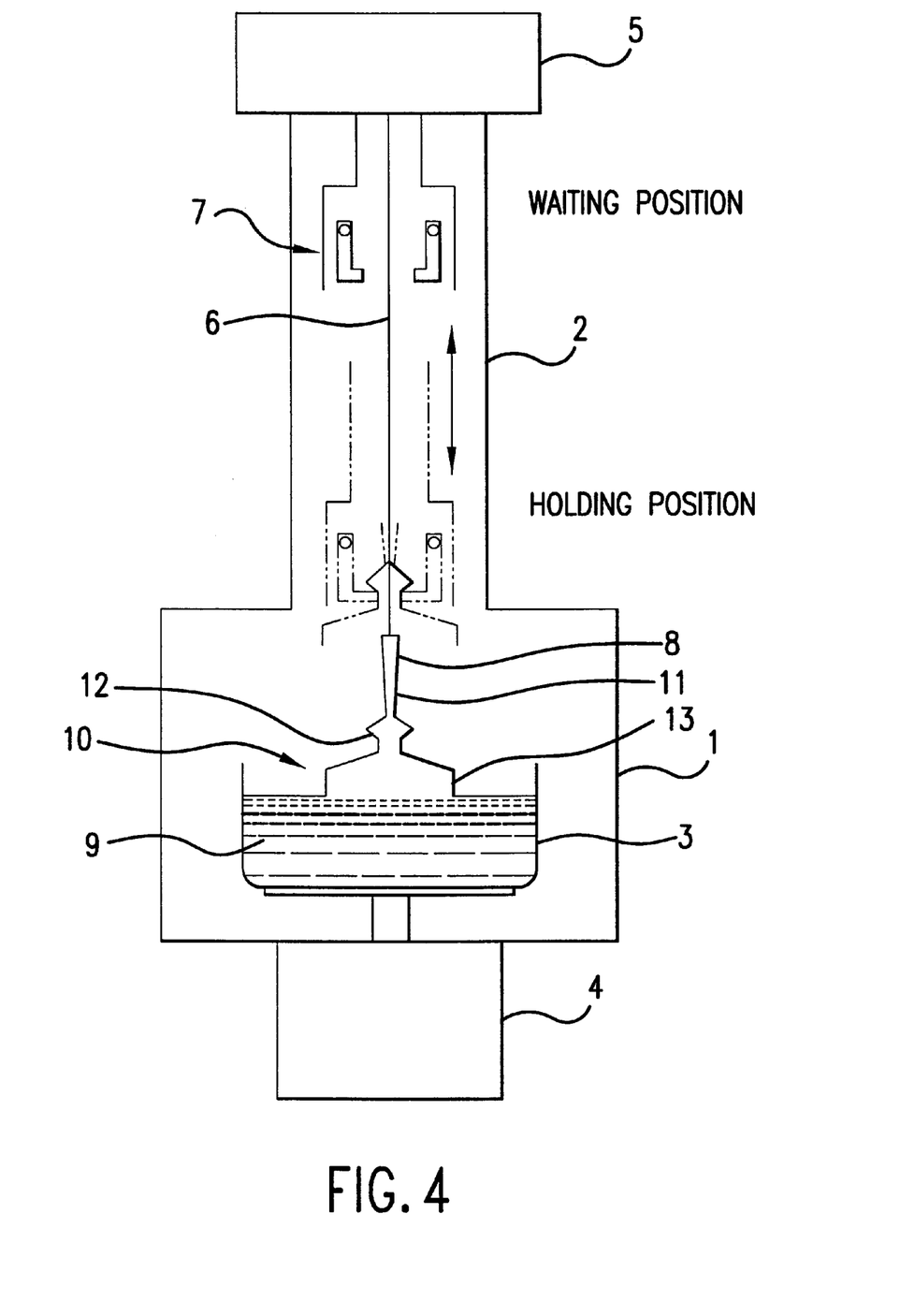
FIG. 4 illustrates a single-crystal manufacturing apparatus suitable for practicing the method of the present invention.

FIG. 4 illustrates a single-crystal manufacturing apparatus suitable to practice the method for manufacturing a silicon single crystal of the present invention. This manufacturing apparatus includes a main chamber 1 and pull chamber 2. The main chamber 1 holds a crucible 3, set at the center thereof. The crucible 3 has a double-layered structure, with an inner quartz crucible being surrounded by an outer graphite crucible, and is positioned on a support shaft referred to as a pedestal. The support shaft is driven by a crucible-driving mechanism 4 which is positioned under the main chamber 1, in the radial or axial direction for rotational or vertical motion of the crucible 3.

The crucible 3 is surrounded by a ring-shaped heater. A rotational pulling up mechanism 5, which rotates, is positioned in the pull chamber 2. The rotational pulling up mechanism 5 pulls up and rotates a pulling up shaft 6. It also pulls up and rotates a chuck mechanism 7, which is suspended by a plurality of wires. Chuck mechanism 7 holds the knob section 12 which is formed on the top section of the single crystal 10 and pulled up from the material melting solution 9.

The main chamber 1 and the pull chamber 2 are maintained in a controlled atmosphere while the silicon material melting solution 9 is formed in the crucible 3. The seed crystal 8 is mounted on the lower end of the pulling up shaft 6 when the shaft is placed in the material melting solution 9, and is pulled up while the shaft 6 is rotated. This allows the single crystal 10 to grow below the seed crystal 8. While the single crystal 10 grows, the crucible 3 is rotated in a reverse direction to the pulling up shaft 6, and is raised to keep the level of the material melting solution 9 constant.

During the neck process, the pulling speed of the pulling up shaft 6, and other conditions, are controlled. After the neck process, the knob section 12 is formed below the neck 11. The knob section 12 has an increased diameter, a decreased diameter and a constant diameter section, 12a, 12b, and 12c, respectively. The rotational speed of the crucible 3 is controlled according to the diameter profile of the knob section 12, i.e., the diameter profile is increased to form the increased diameter section 12a, decreased to form the decreased diameter section 12b, and remains constant to form the constant diameter section 12c (see FIGS. 5 and 6). Changing the diameter profile also considers the pulling speed. If the pulling speed were not considered, the rotational speed of the crucible 3 would yield diameters larger than that of the target diameter profile. The pulling speed is controlled such that it decreases during the initial stage of the knob 12 formation, increases to form the increased diameter section 12a, remains constant to form the decreased diameter section 12b, and increases again to form the constant diameter section 12c (refer to FIG. 7).

A combination of changing the rotational speed to control the crucible 3 and the pulling speed to control the single crystal 10 is used to form the knob section 12 of target diameter profile in a short time. In order to maintain a constant diameter of a decreased size, the pulling speed is set at a constant.

Once the knob section 12 has been formed, the pulling speed of the crystal is decreased sufficiently to form the crystal body 13 below the knob section 12.

The crystal body 13 is mechanically held at the knob section 12 by the chuck mechanism 7. The knob section 12 is reproducibly formed and has the target diameter profile and may thus be held securely by the chuck mechanism 7. The phrase "reproducibly formed" refers to a knob which can be reproduced repeatedly, having the same dimensions and shape. Next, the chuck mechanism 7 is pulled up while being rotated simultaneously with the pulling up shaft 6. This process allows a stable manufacture of a single crystal having a diameter of 10 of 12 inches.

Examples

Figure 5:
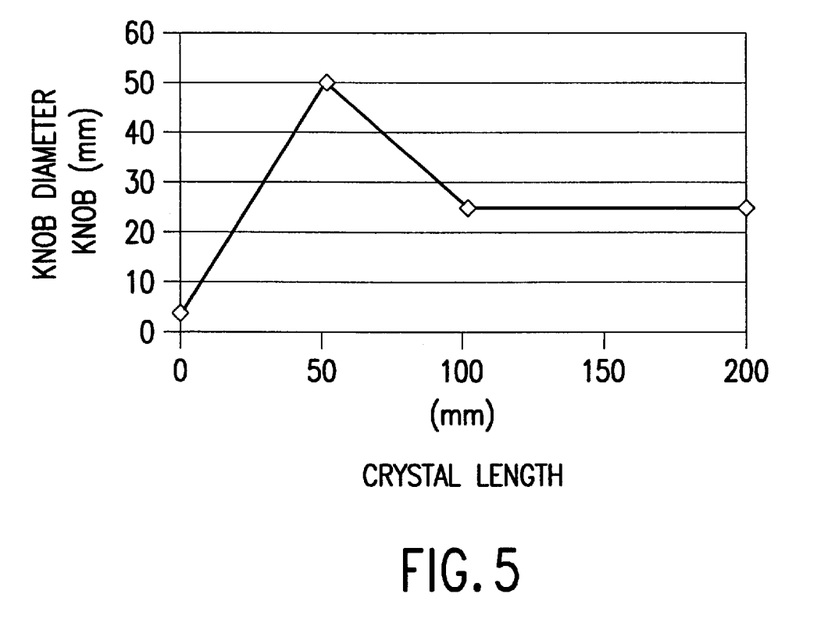
FIG. 5 illustrates a target diameter profile of the knob section.
Figure 6:
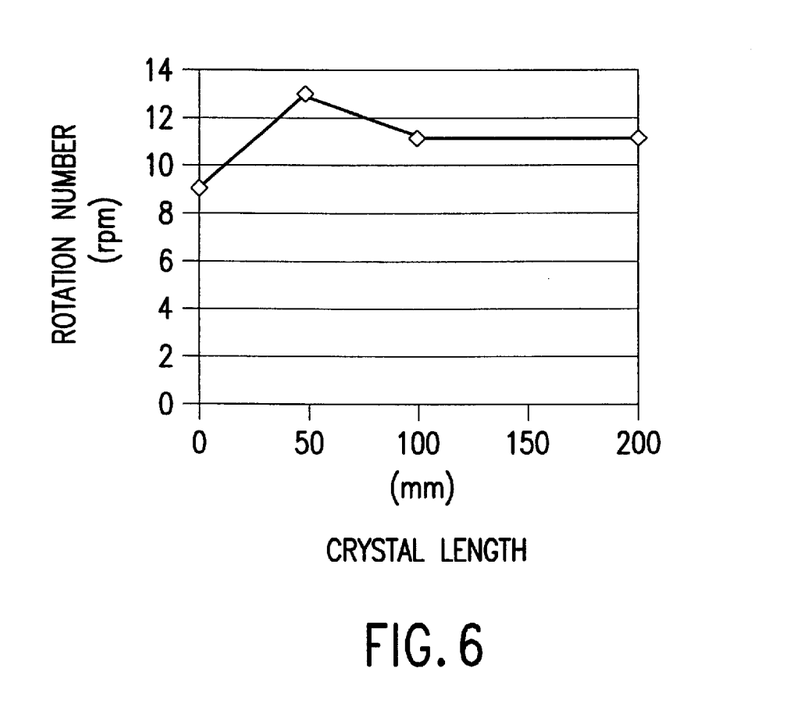
FIG. 6 illustrates a pattern for controlling the rotational speed of the crucible when forming the knob section.
Figure 7:
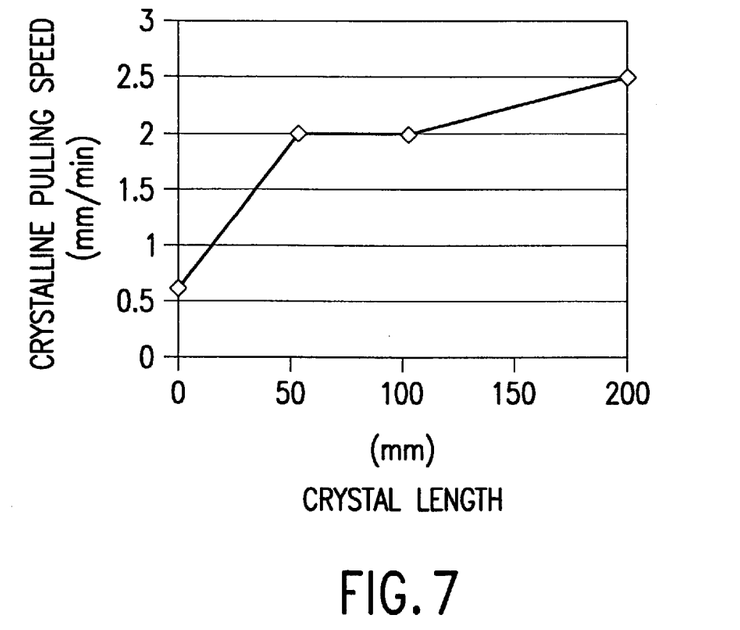
FIG. 7 illustrates a pattern for controlling the pulling speed when forming the knob section.

The following examples clarify the present invention by comparing the results with those of comparative examples. In these examples, a silicon single crystal of 12 inches in diameter was manufactured from 300 kg of polycrystalline silicon using a crucible having a 30 inch diameter. FIG. 5 illustrates the target diameter profile of the knob section, and FIGS. 6 and 7 illustrate patterns to controls the rotational speed of the crucible and the pulling speed when manufacturing the knob section. In these examples, the temperature of the material melting solution was maintained constant.

In the comparative examples, the knob section was formed either by controlling pulling speed alone, or by a combination of controlling the pulling speed and the heater output (FIG. 5). The pattern of the pulling speed is illustrated in FIG. 8, where the rotational speed and the temperature of the material melting solution were set to 12 rpm.

Figure 9:
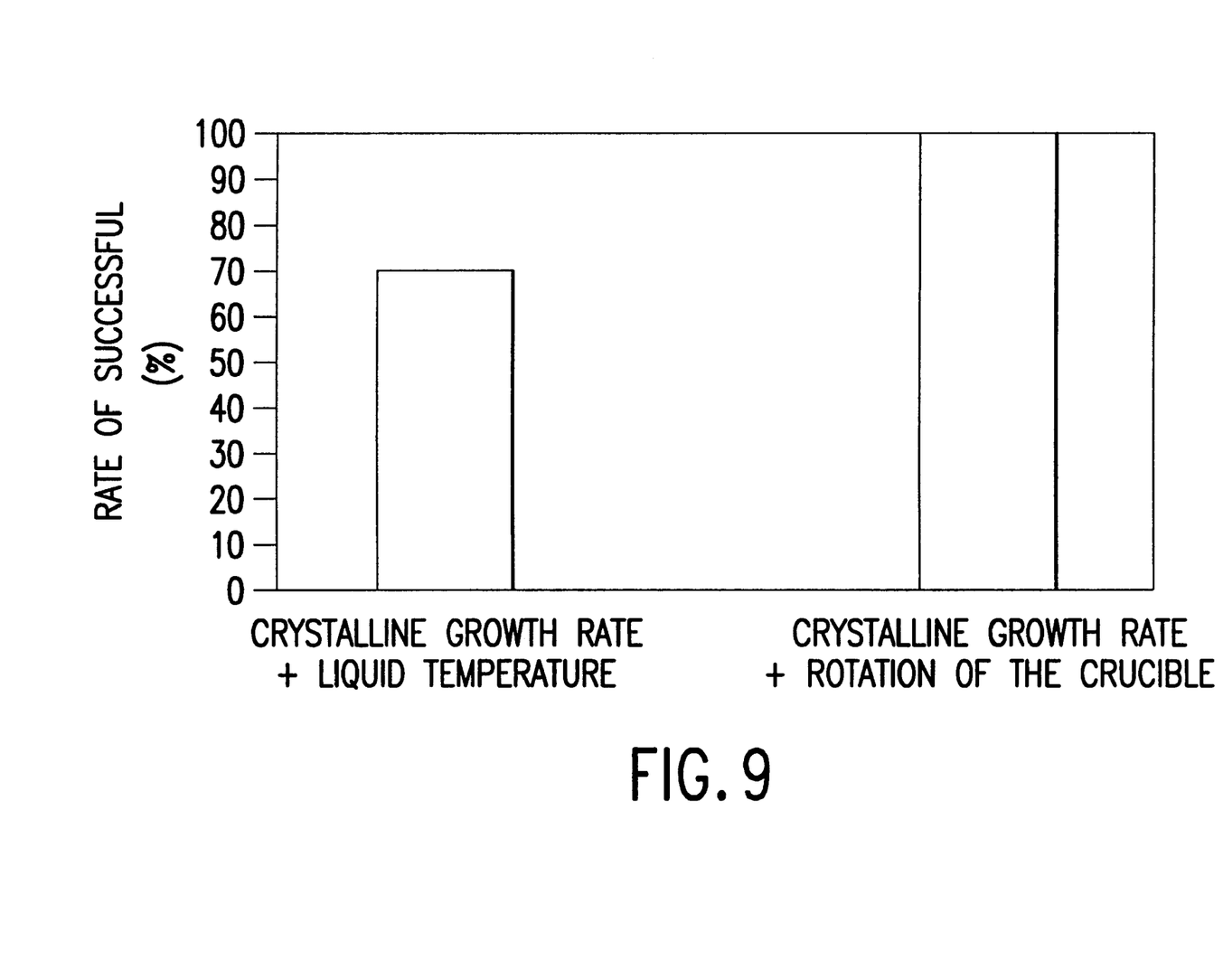
FIG. 9 compares the rate of successful crystal holding observed in the example for describing the method of the present invention with that observed in the comparative example.

FIG. 9 compares the growth rate of the crystal when effected by changing the temperature of the material melting solution with the growth rate when effected by rotating the crucible.

Figure 8:
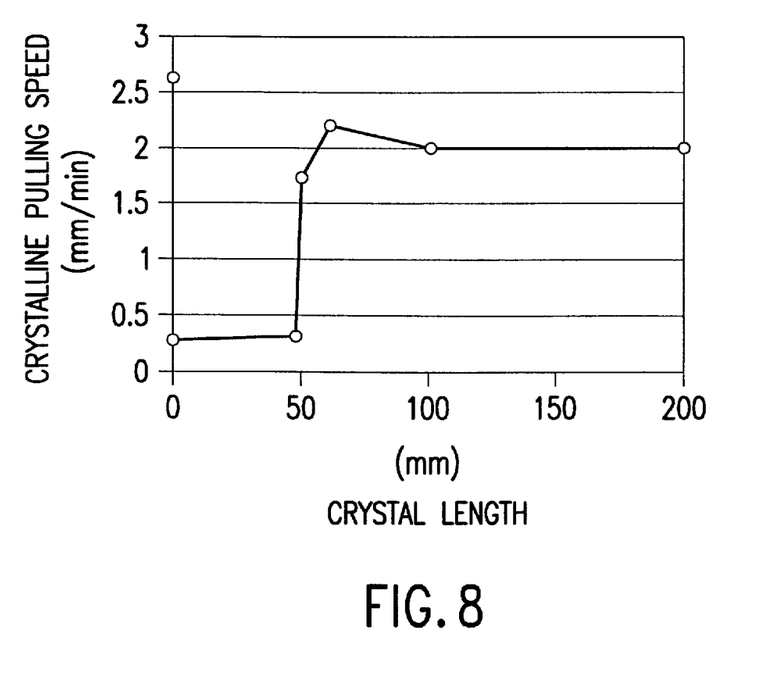
FIG. 8 illustrates a pattern for controlling the pulling speed when it is used as the sole controlling mode for forming the knob section.

As shown in FIG. 8, when the knob section was formed by only controlling the pulling speed, it was necessary to keep the speed at 0.3 mm/min to form the increased diameter section 12a of the knob section 12. After the increased diameter section 12a was formed, the pulling speed was increased. Nevertheless, it took 2 hours to form a 200 mm long knob section 12 at an average pulling speed of 1.6 mm/min.

When the knob section was formed by a combination of controlling the pulling speed and the heater output for manufacturing the 200 mm long knob section 12, the average pulling speed was increased to 1.85 mm/min, decreasing the time to form the knob section to 1.8 hours. However, in this case the reproducibility of the diameter profile of the knob section formed was low, and the rate of successful crystal holding was also low, at 70% (FIG. 9).

By contrast, the examples of the present invention illustrate a gradually increasing rotational speed of the crucible used to form the increased diameter section 12a of the knob section 12, a gradually decreasing rotational speed to form the decreased diameter section 12b, and a constant rotational speed to form the constant diameter section 12c (FIG. 6). The pulling speed was decreased to 0.6 mm/min when formation of the knob section 12 was started. However, the pulling speed was gradually increased to form the increased diameter section 12a and the constant diameter section 12c. The final pulling speed was 2.5 mm/min (FIG. 7), which was almost the same as that used during the neck process. As a result, the average pulling speed for forming the 200 mm long knob section was increased to 19 mmImin, decreasing the time required to form the knob section to 1.7 hours. The reproducibility of the diameter profile of the knob section 12 was also high, and rate of successful crystal holding was 100% (FIG. 9).

Thus, the present invention can form a reproducible knob section 12 in a shorter time than the conventional method. These two improvements increase productivity and efficiency by allowing the crystal to be held more securely.

One skilled in the art will appreciate that the appropriate patterns for controlling the rotational speed of the crucible and the pulling speed are determined according to the specific requirements of the target diameter profile, and hence not limited to those described in examples. The temperature of the material melting solution temperature can be also controlled, as necessary, while the knob section is formed.

As described above, the method of the present invention for manufacturing silicon single crystal, which pulls up the single crystal while mechanically holding a knob section formed at the upper end of the single crystal, controls the rotational speed of the crucible so that it may form a reproducible knob section. This knob section is formed in a time efficient manner.

What is claimed is:

1. A method for manufacturing a silicon single crystal using a Czochralski (CZ) method, comprising: pulling up a manufactured single crystal from a material melting solution held in a crucible, while mechanically holding the crystal at a section formed at an upper end of the crystal and having a larger diameter than a neck of the seed, wherein a crucible rotational speed is controlled to form said section at which the crystal is held.

2. The method for manufacturing a silicon single crystal according to claim 1, wherein a crucible rotational speed and a single crystal pulling speed are controlled to form said section at which the crystal is held.

3. The method for manufacturing a silicon single crystal according to claim 2, wherein the single crystal pulling speed is increased while the rotational speed of the crucible is increased to create a diameter profile which is larger than said section of a target diameter profile, thereby offsetting a reduced crystal diameter resulting from the increased single crystal pulling speed.

* * * * *